(12) United States Patent
Hassoun et al.

(10) Patent No.: US 6,289,068 B1
(45) Date of Patent: Sep. 11, 2001

(54) DELAY LOCK LOOP WITH CLOCK PHASE SHIFTER

(75) Inventors: Joseph H. Hassoun, Los Gatos; F. Erich Goetting, Cupertino; John D. Logue, Placerville, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/102,740

(22) Filed: Jun. 22, 1998

(51) Int. Cl.$^7$ ................. H03D 3/24; H04L 7/06; H04L 7/00

(52) U.S. Cl. ............... 375/376; 327/156; 327/158; 327/161

(58) Field of Search ............................ 375/376, 371, 375/373, 354; 327/269, 270, 271, 276, 277, 284, 147, 149, 158, 161, 156, 162, 231, 237, 238; 713/401, 503

(56) References Cited

U.S. PATENT DOCUMENTS

| | | |
|---|---|---|
| 5,465,076 | 11/1995 | Yamauchi et al. . |
| 5,489,864 | 2/1996 | Ashuri ................................. 327/161 |
| 5,646,564 | 7/1997 | Erickson et al. ..................... 327/158 |
| 5,712,884 | * 1/1998 | Jeong .................................. 375/375 |
| 5,796,673 | * 8/1998 | Foss et al. ........................... 365/233 |

FOREIGN PATENT DOCUMENTS

| | | |
|---|---|---|
| 0655840A2 | 11/1994 | (EP) . |
| 0704975A1 | 4/1996 | (EP) . |
| 5-191233 | 7/1993 | (JP) . |
| WO 97/40576 | 10/1997 | (WO) . |
| WO 99/14759 | 3/1999 | (WO) . |

OTHER PUBLICATIONS

Microelectronics Group, Lucent Technologies, Inc., Preliminary Data Sheet, May 1998, ORCA OR3Cxx (5 V), and OR3Txxx (3.3 V) Series Field–Programmable Gate Arrays, pp. 3, 69–80, available from Microelectronics Group, Lucent Technologies, Inc., 555 Union Boulevard, Room 30L–15P–BA, Allentown, PA 18103.

"Actel ES Family Digital Phase Lock Loop Usage", by Joel Landry, Sep. 17, 1996, pp. 1–5, available from Actel Corp., 955 East Arques Avenue, Sunnyvale, California 94086.

* cited by examiner

Primary Examiner—Stephen Chin
Assistant Examiner—Betsy L. Deppe
(74) Attorney, Agent, or Firm—Edward S. Mao

(57) ABSTRACT

A delay lock loop uses a clock phase shifter with a delay line to synchronize a reference clock signal with a skewed clock signal. The delay line is coupled to a reference input terminal of the delay lock loop and generates a delayed clock signal that is provided to the clock phase shifter. The clock phase shifter generates one or more phase-shifted clock signals from the delayed clock signal. An output generator coupled to the delay line, the clock phase shifter, and an output terminal of the delay lock loop provides either the delayed clock signal or one of the phase-shifted clock signals as an output clock signal of the delayed lock loop. The propagation delay of the delay line is set to synchronize the reference clock signal with the skewed clock signal, which is received on a feedback input terminal of the delay lock loop. A phase detector compares the reference clock signal and the skewed clock signal to determine the appropriate propagation delay for the delay line.

24 Claims, 12 Drawing Sheets

DELAY LOCK LOOP WITH CLOCK PHASE SHIFTER

CROSS-REFERENCE TO RELATED APPLICATIONS

This application relates to commonly assigned, concurrently filed U.S. patent application Ser. No. 09/102/704, "Glitchless Delay Line Using Gray Code Multiplexer", which is incorporated herein by reference.

FIELD OF THE INVENTION

The present invention relates to delay lock loops (DLLs) for digital electronics. More specifically, the present invention relates to DLLs capable of locking clock signals over a wide frequency range.

BACKGROUND OF THE INVENTION

Synchronous digital systems, including board level systems and chip level systems, rely on one or more clock signals to synchronize elements across the system. Typically, one or more clock signals are distributed across the system on one or more clock lines. However, due to various problems such as clock buffer delays, high capacitance of heavily loaded clock lines, and propagation delays, the rising edges of a clock signal in different parts of the system may not be synchronized. The time difference between a rising (or falling) edge in one part of the system with the corresponding rising (or falling) edge in another part of the system is referred to as "clock skew".

Clock skew can cause digital systems to malfunction. For example, it is common for circuits in digital systems to have a first flip-flop output driving a second flip-flop input. With a synchronized clock on the clock input of both flip-flops, the data in the first flip-flop is successfully clocked into the second flip-flop. However, if the active edge on the second flip flop is delayed by clock skew, the second flip-flop might not capture the data from the first flip-flop before the first flip-flop changes state.

Delay lock loops are used in digital systems to minimize clock skew. Delay lock loops typically use delay elements to synchronize the active edges of a reference clock signal in one part of the system with a feedback clock signal from a second part of the system. FIG. 1 shows a block diagram of a conventional delay lock loop 100 coupled to logic circuits 190. Delay lock loop 100, which comprises a delay line 110 and a phase detector 120, receives a reference clock signal REF_CLK and drives an output clock signal O_CLK.

Delay line 110 delays reference clock signal REF_CLK by a variable propagation delay D before providing output clock signal O_CLK. Thus, each clock edge of output clock signal O_CLK lags a corresponding clock edge of reference clock signal REF_CLK by propagation delay D (see FIG. 2A). Phase detector 120 controls delay line 110, as described below. Delay line 110 is capable of producing a minimum propagation delay D_MIN and a maximum propagation delay D_MAX.

Before output clock signal O_CLK reaches logic circuits 190, output clock signal O_CLK is skewed by clock skew 180. Clock skew 180 can be caused by delays in various clock buffers (not shown) or propagation delays on the clock signal line carrying output clock signal O_CLK (e.g., due to heavy loading on the clock signal line). To distinguish output clock signal O_CLK from the skewed version of output clock signal O_CLK, the skewed version is referred to as skewed clock signal S_CLK. Skewed clock signal S_CLK drives the clock input terminals (not shown) of the clocked circuits within logic circuits 190. Skewed clock signal S_CLK is also routed back to delay lock loop 100 on a feedback path 170. Typically, feedback path 170 is dedicated specifically to routing skewed clock signal S_CLK to delay lock loop 110. Therefore, any propagation delay on feedback path 170 is minimal and causes only negligible skewing.

FIG. 2A provides a timing diagram of reference clock signal REF_CLK, output clock signal O_CLK, and skewed clock signal S_CLK. All three clock signals have the same frequency F (not shown) and period P, and all are active-high (i.e., the rising edge is the active edge). Since output clock signal O_CLK is delayed by propagation delay D, a clock edge 220 of output clock signal O_CLK lags corresponding clock edge 210 of reference clock signal REF_CLK by propagation delay D. Similarly, a clock edge 230 of skewed clock signal S_CLK lags corresponding clock edge 220 of output clock signal O_CLK by a propagation delay SKEW, which is the propagation delay caused by clock skew 180 (FIG. 1). Therefore, clock edge 230 of skewed clock signal S_CLK lags clock edge 210 of reference clock signal REF_CLK by a propagation delay DSKEW, which is equal to propagation delay D plus propagation delay SKEW.

Delay lock loop 100 controls propagation delay D by controlling delay line 110. However, delay line 110 cannot create negative delay; therefore, clock edge 230 cannot be synchronized to clock edge 210. Fortunately, clock signals are periodic signals. Therefore, delay lock loop 100 can synchronize reference clock signal REF_CLK and skewed clock signal S_CLK by further delaying output clock signal O_CLK such that clock edge 240 of skewed clock signal S_CLK is synchronized with clock edge 210 of reference clock signal REF_CLK. As shown in FIG. 2B, propagation delay D is adjusted so that propagation delay DSKEW is equal to period P. Specifically, delay line 110 is tuned so that propagation delay D is increased until propagation delay D equals period P minus propagation delay SKEW. Although propagation delay DSKEW could be increased to any multiple of period P to achieve synchronization, most delay lock loops do not include a delay line capable of creating such a large propagation delay.

Phase detector 120 (FIG. 1) controls delay line 110 to regulate propagation delay D. The actual control mechanism for delay lock loop 100 can differ. For example, in one version of delay lock loop 100, delay line 110 starts with a propagation delay D equal to minimum propagation delay D_MIN, after power-on or reset. Phase detector 110 then increases propagation delay D until reference clock signal REF_CLK is synchronized with skewed clock signal S_CLK. In another system, delay lock loop 100 starts with a propagation delay D equal to the average of minimum propagation delay D_MIN and maximum propagation delay D_MAX, after power-on or reset. Phase detector 120 then determines whether to increase or decrease (or neither) propagation delay D to synchronize reference clock signal REF_CLK with skewed clock signal S_CLK. For example, phase detector 120 would increase propagation delay D for the clock signals depicted in FIG. 2A. However, phase detector 120 would decrease propagation delay D for the clock signals depicted in FIG. 2C.

In FIG. 2C, skewed clock signal S_CLK is said to "lag" reference clock signal REF_CLK, because the time between a rising edge of reference clock signal REF_CLK and the next rising edge of skewed clock signal S_CLK is less than the time between a rising edge of skewed clock signal S_CLK and the next rising edge of reference clock signal REF_CLK. However, in FIG. 2A, reference clock signal REF_CLK is said to "lag" skewed clock signal S_CLK, because the time between a rising edge of skewed clock signal S_CLK and the next rising edge of reference clock signal REF_CLK is less than the time between a rising edge of reference clock signal REF_CLK and the next rising clock edge of skewed clock signal S_CLK. Alternatively, in FIG. 2A skewed clock signal S_CLK could be said to "lead" reference clock signal REF_CLK.

After synchronizing reference clock signal REF_CLK and skewed clock signal S_CLK, delay lock loop 100 monitors reference clock signal REF_CLK and skewed clock signal S_CLK and adjusts propagation delay D to maintain synchronization. For example, if propagation delay SKEW increases, perhaps caused by an increase in temperature, delay lock loop 100 must decrease propagation delay D to compensate. Conversely, if propagation delay SKEW decreases, perhaps caused by a decrease in temperature, delay lock loop 100 must increase propagation delay D to compensate. The time in which delay lock loop 100 is attempting to first synchronize reference clock signal REF_CLK and skewed clock signal S_CLK, is referred to as lock acquisition. The time in which delay lock loop 100 is attempting to maintain synchronization is referred to as lock maintenance. The value of propagation delay D at the end of lock acquisition, i.e. when synchronization is initially established, is referred to as initial propagation delay ID.

However, as explained above, delay line 110 can only provide a propagation delay between a minimum propagation delay D_MIN and a maximum propagation delay D_MAX. During lock maintenance, delay lock loop 100 may lose synchronization if a propagation delay D smaller than minimum propagation delay D_MIN is required to maintain synchronization. Similarly, synchronization may be lost if a propagation delay D greater than maximum propagation delay D_MAX is required to maintain synchronization.

For example, if lock acquisition occurs while the system using delay lock loop 100 is at a very high temperature, delay lock loop 100 is likely to achieve synchronization with a very small initial propagation delay ID, since propagation delay SKEW is likely to be large with respect to period P. As the system's temperature increases further, propagation delay SKEW is likely to increase to a point where propagation delay SKEW plus minimum propagation delay D_MIN is greater than period P. In this situation, delay lock loop 100 must undergo lock acquisition again, which may introduce glitches and noise into output clock signal O_CLK, in turn causing glitches and noise in skewed clock signal S_CLK. For critical systems, such glitches are intolerable. Further, for systems designed for operation at multiple clock frequencies, low frequency operation is likely to compound the problems since clock period P is very long. Long clock periods may cause propagation delay D to vary over a wider time interval. Thus, there is a need for a delay lock loop which can maintain synchronization over a wide range of clock frequencies and environmental extremes.

SUMMARY OF THE INVENTION

The present invention provides a delay lock loop that synchronizes the reference clock signal with the skewed clock signal using a delay line having an initial propagation delay within a lock window. The lock window is a period of time between the minimum delay of the propagation delay and the maximum propagation delay. The extent of the lock window is chosen to ensure that changes in environmental conditions or clock frequencies, when compensated for by changing the propagation delay of the delay line, do not cause a loss of synchronization. A delay lock loop in accordance with one embodiment of the present invention incorporates a clock phase shifter in addition to the delay line to synchronize the reference clock. The increased flexibility provided by the clock phase shifter dramatically reduces the probability of losing clock synchronization during system operation.

The delay line receives the reference clock signal from a reference input terminal of the delay lock loop. The output of the delay line (i.e., the delayed clock signal) is provided to the clock phase shifter, which can generate one or more phase-shifted clock signals. An output generator receives the delayed clock signal and the one or more phase-shifted clock signals. The output generator provides one of the clock signals as the output clock signal on an output terminal. A phase detector compares the reference clock signal with the skewed clock signal, which is received on a feedback input terminal of the delay lock loop, to determine whether to increase or decrease the propagation delay of the delay line to synchronize the reference clock signal and the skewed clock signal.

One embodiment of the clock phase shifter generates N−1 phase-shifted clock signals. Each of the phase-shifted clock signals is phase-shifted from the other N−2 clock signals and the delayed clock signal by 360/N degrees. For example, if the clock phase shifter generated 3 phase-shifted clock signals (i.e., N is equal to four), the phase-shifted clock signals would be phase-shifted from the delayed clock signal by 90 degrees, 180 degrees, and 270 degrees. The clock phase shifter can be implemented using N delay lines and a phase detector.

The delay lock loop can include a controller to control the delay line and the output generator. In one embodiment of the invention, the controller causes the output generator to drive the delayed clock signal as the output clock. The controller synchronizes the reference clock signal with the skewed clock signal by adjusting the propagation delay of the delay line to an initial delay. If the initial delay is not within the lock window, the controller causes the output generator to drive a first phase-shifted clock signal as the output signal. The controller and phase detector then synchronize the reference clock signal with the skewed clock signal by adjusting the propagation delay of the delay line to a second initial delay. If the second initial delay is not within the lock window, the controller causes the output generator to use a second phase-shifted clock signal as the output clock. The controller continues in this manner until an initial delay within the lock window is found.

In another embodiment of the invention, the clock phase shifter is coupled to receive the reference clock signal. The clock phase shifter generates phase-shifted clock signals that are phase-shifted from the reference clock signals. The reference clock signal or one of the phase-shifted clock signals from the clock shifter is selected to be the input signal of the delay line. The delay line is controlled by the controller and the phase detector to delay the input clock signal and synchronize the skewed clock signal with the reference clock signal.

Thus, the present invention provides delay lock loop circuits that can be used in IC devices and digital systems that must endure varying environmental conditions. The delay lock loop circuits of the present invention are well suited for low frequency applications. The present invention will be more fully understood in view of the following description and drawings.

DETAILED DESCRIPTION OF THE DRAWINGS

Figure 1:
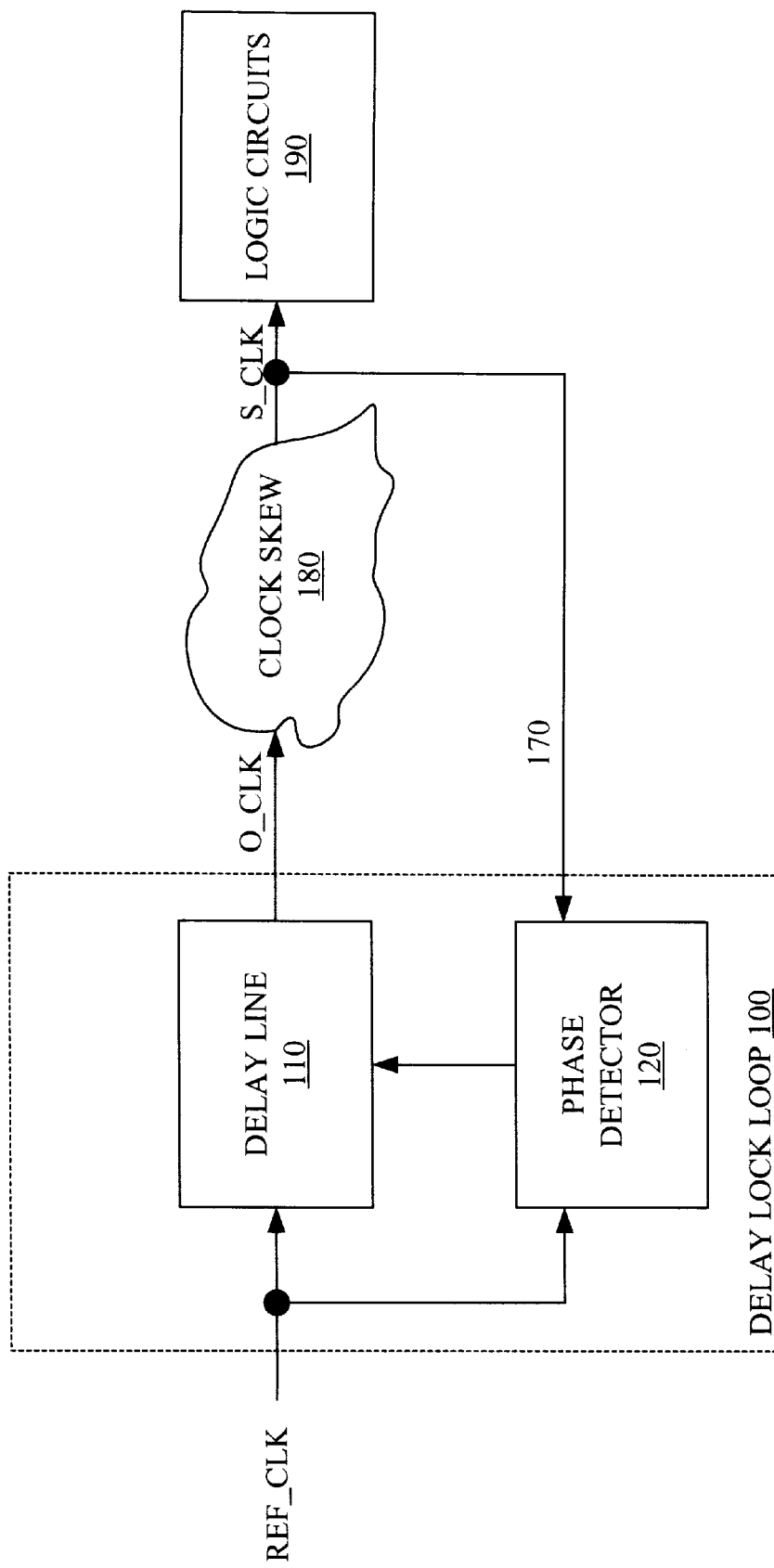
FIG. 1 is a block diagram of a system using a conventional delay lock loop.
Figure 2A:
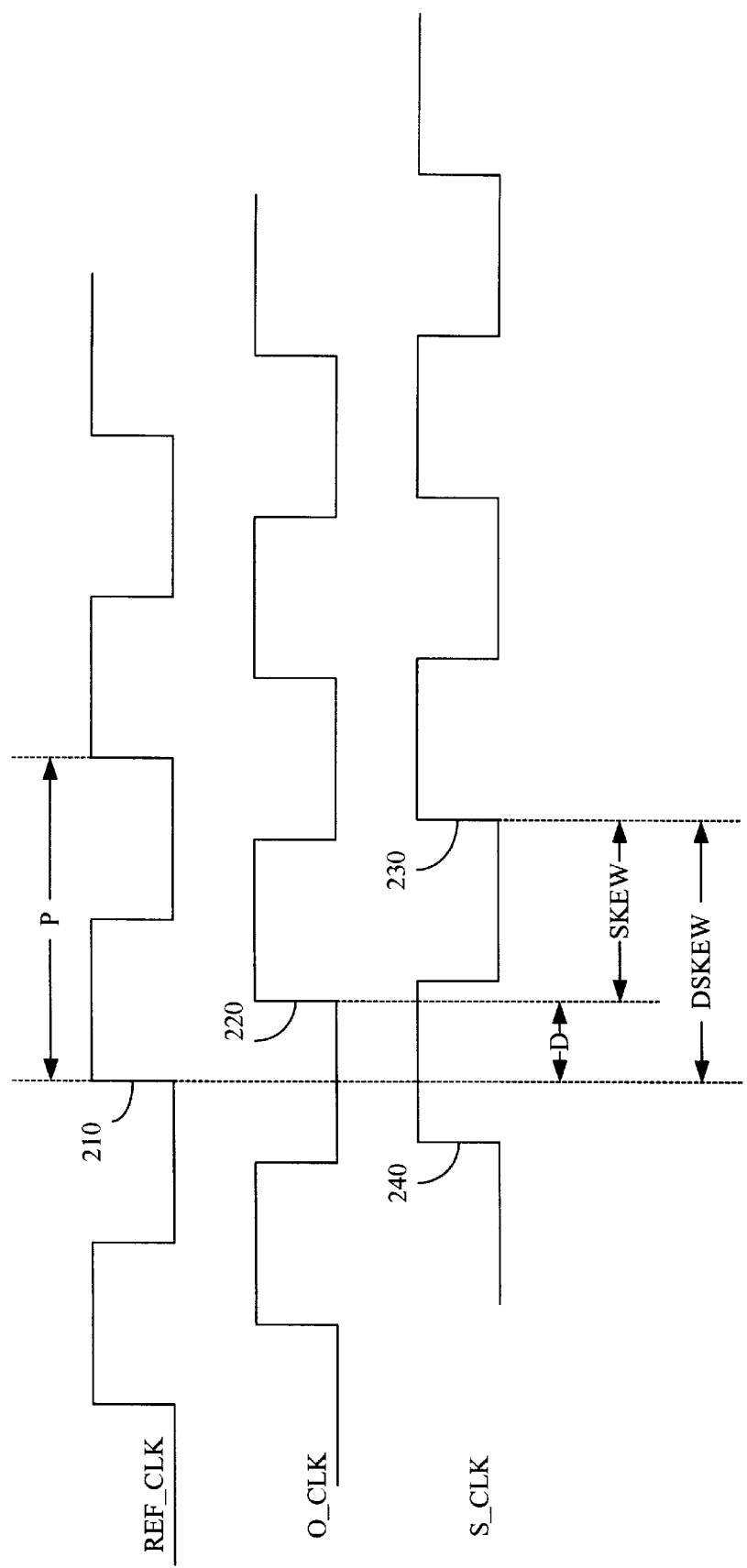
FIGS. 2A, 2B and 2C are timing diagrams for the system of FIG. 1.
Figure 2B:
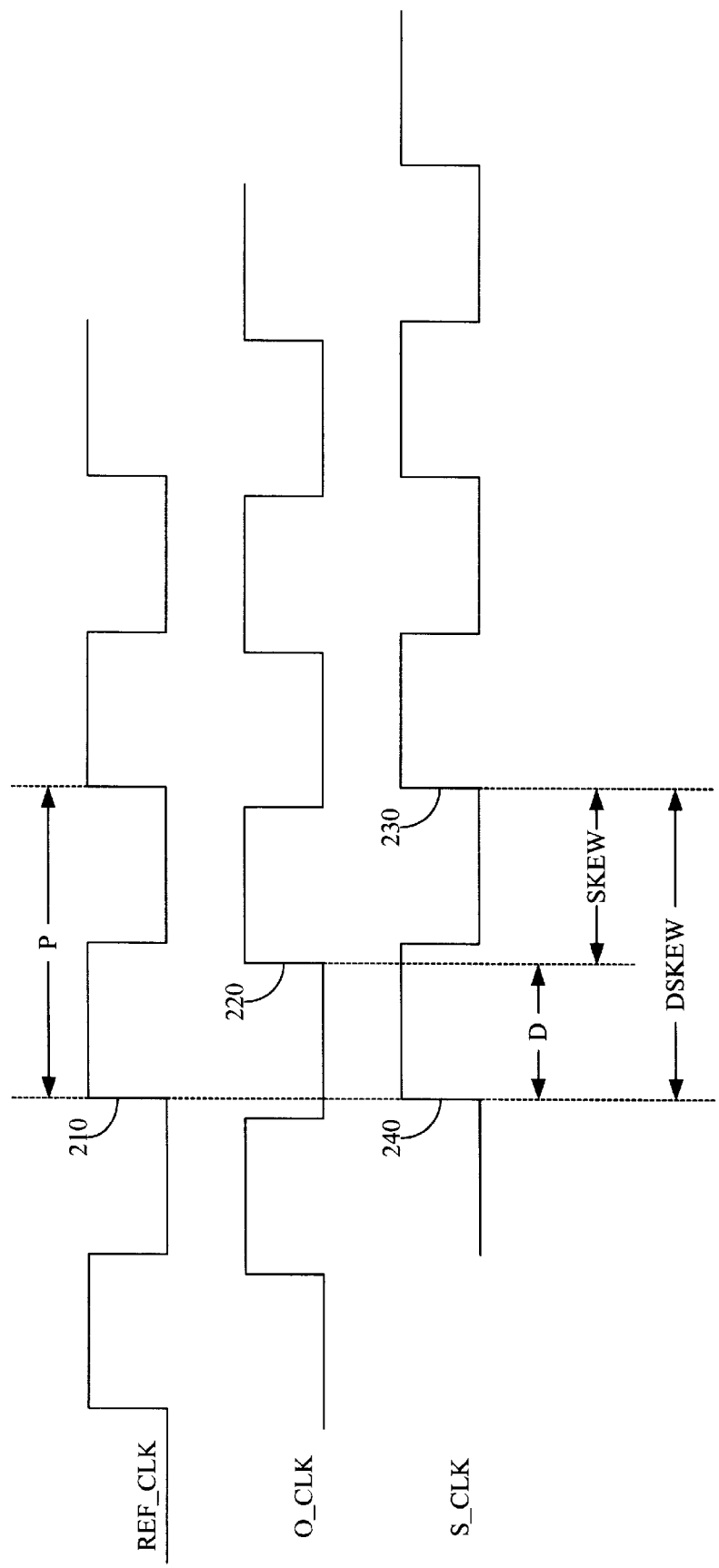
Figure 2C:
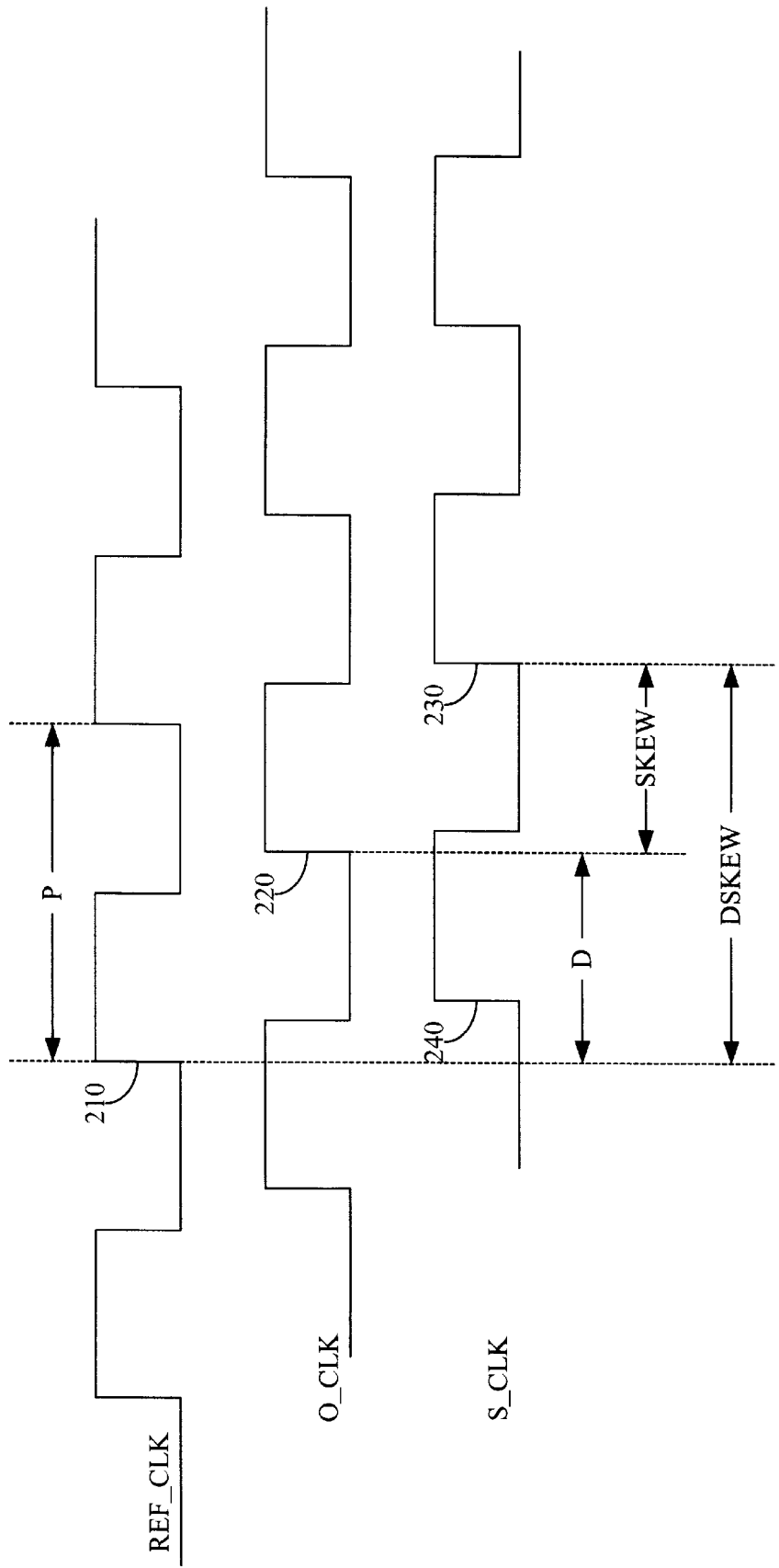
Figure 3:
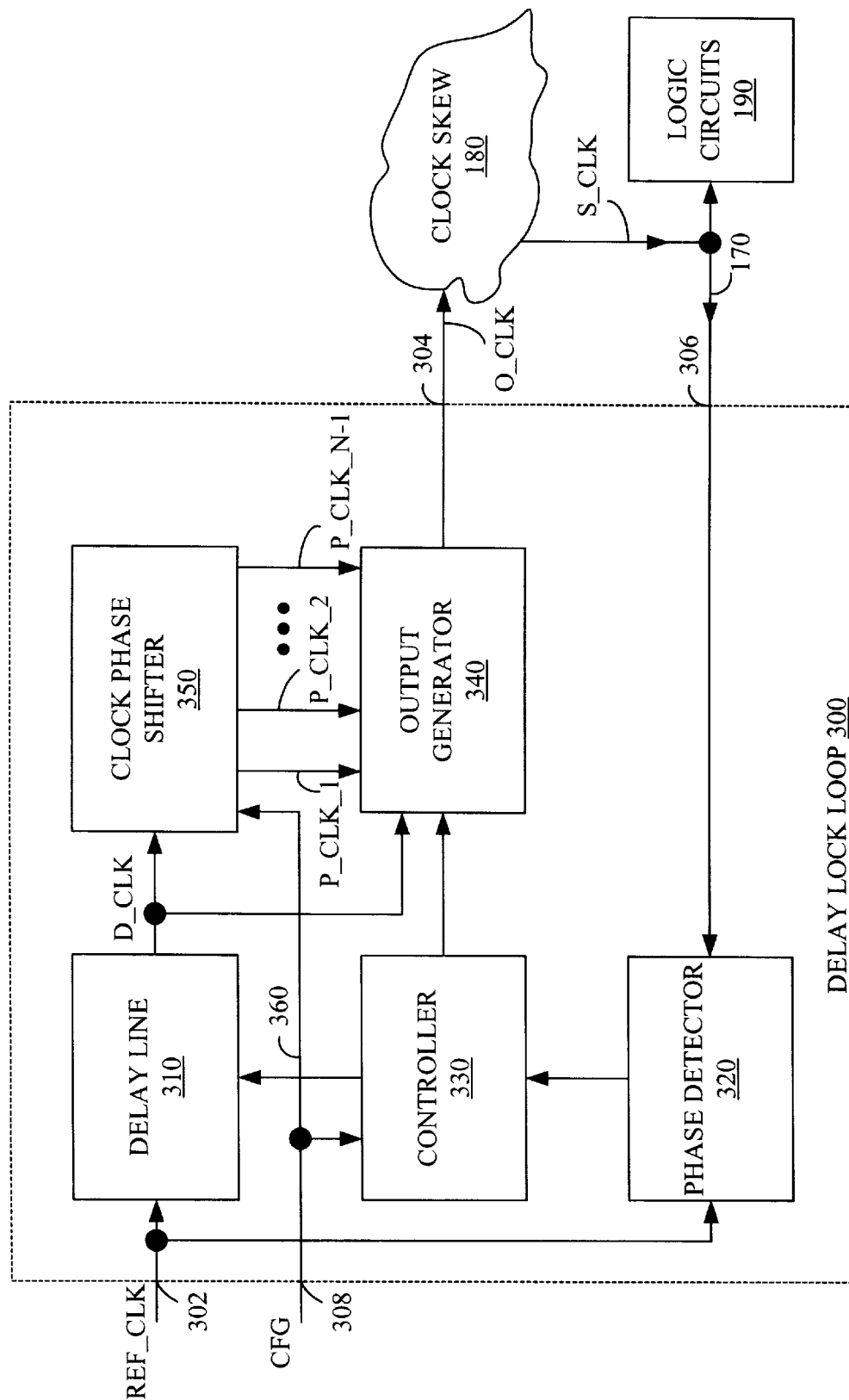
FIG. 3 is a block diagram of a system using an embodiment of a delay lock loop in accordance with the present invention.

FIG. 3 is a block diagram of a system using a delay lock loop 300 in accordance with one embodiment of the present invention. Delay lock loop 300 comprises a delay line 310, a clock phase shifter 350, a controller 330, an output generator 340, and a phase detector 320. Delay lock loop 300 receives reference clock signal REF_CLK on a reference input terminal 302 and generates output clock signal O_CLK on output terminal 304. As explained above with respect to FIG. 1, output clock signal O_CLK is skewed by clock skew 180 into skewed clock signal S_CLK, which clocks logic circuits 190. Skewed clock signal S_CLK is also fed back to a feedback terminal 306 of delay lock loop 300 on feedback path 170.

Within delay lock loop 300, reference clock signal REF_CLK is delayed by delay line 310 to generate delayed clock signal D_CLK. Delayed clock signal D_CLK is delayed from clock signal REF_CLK by a propagation delay D in delay line 310. One embodiment of delay lock loop 300 uses an adjustable delay line described in U.S. patent application Ser. No. 09/102,704, entitled "Glitchless Delay Line Using Gray Code Multiplexer", which is referenced above. However, other adjustable delay lines can also be used with delay lock loop 300. Delayed clock signal D_CLK is provided to an input terminal of a clock phase shifter 350 and to an input terminal of an output generator 340.

Clock phase shifter 350 generates one or more phase-shifted clock signals P_CLK_1 to P_CLK_N−1, where N is a positive integer. In one embodiment, phase-shifted clock signal P_CLK_1 is phase-shifted by 360/N degrees from delayed clock signal D_CLK. Phase-shifted clock signal P_CLK_2 is phase-shifted by 2*(360/N) degrees. Phase-shifted clock signal P_CLK_N−1 is phase-shifted by (N−1)*(360/N) degrees. Thus, in general a phase-shifted clock signal P_CLK_Z is phase-shifted by Z*(360/N) degrees, where Z is an integer between 1 and (N−1), inclusive. Delayed clock signal D_CLK can be considered a phase-shifted clock signal P_CLK_0 since delayed clock signal D_CLK has a 0 degree phase shift from itself. Further, in some embodiments of delay lock loop 300, clock phase shifter 350 generates a phase-shifted signal P_CLK_N that has the same phase and frequency as delayed clock signal D_CLK delayed clock signal D_CLK.

Thus, in an embodiment of clock phase shifter 350 where N is equal to four, phase-shifted clock signal P_CLK_1 is phase-shifted 90 degrees from delayed clock signal D_CLK. It logically follows that phase-shifted clock signal P_CLK_2 is phase-shifted by 180 degrees from delayed clock signal D_CLK and phase-shifted clock signal P_CLK_3 is phase-shifted by 270 degrees from delayed clock signal D_CLK. However, the principles of the present invention are also suitable for other embodiments of clock phase shifter 350 using other patterns of phase shifting between the phase-shifted clock signals.

Phase shifting is a concept in the frequency domain of a clock signal. The equivalent of phase shifting in the time domain is delaying the clock signal. Specifically, if a first clock signal is phase-shifted from a second clock signal by X degrees, the first clock signal is delayed by X*(P/360), where P is the period of the first and second clock signals. Thus, if phase-shifted clock signal P_CLK_1 is phase-shifted 90 degrees from delayed clock signal D_CLK, phase-shifted clock signal P_CLK_1 is delayed by one-fourth of the period of delayed clock signal D_CLK. To distinguish delays caused by phase shifting from other propagation delays, delays caused by phase shifting are referred to as phase-shifted delays P_D_Z. Since a phase-shifted clock signal P_CLK_Z is phase-shifted by Z*(360/N) degrees, phase-shifted clock signal P_CLK_Z has a phase-shifted delay P_D_Z equal to Z*(P/N), where Z is an integer between 1 and (N−1), inclusive.

Figure 4:
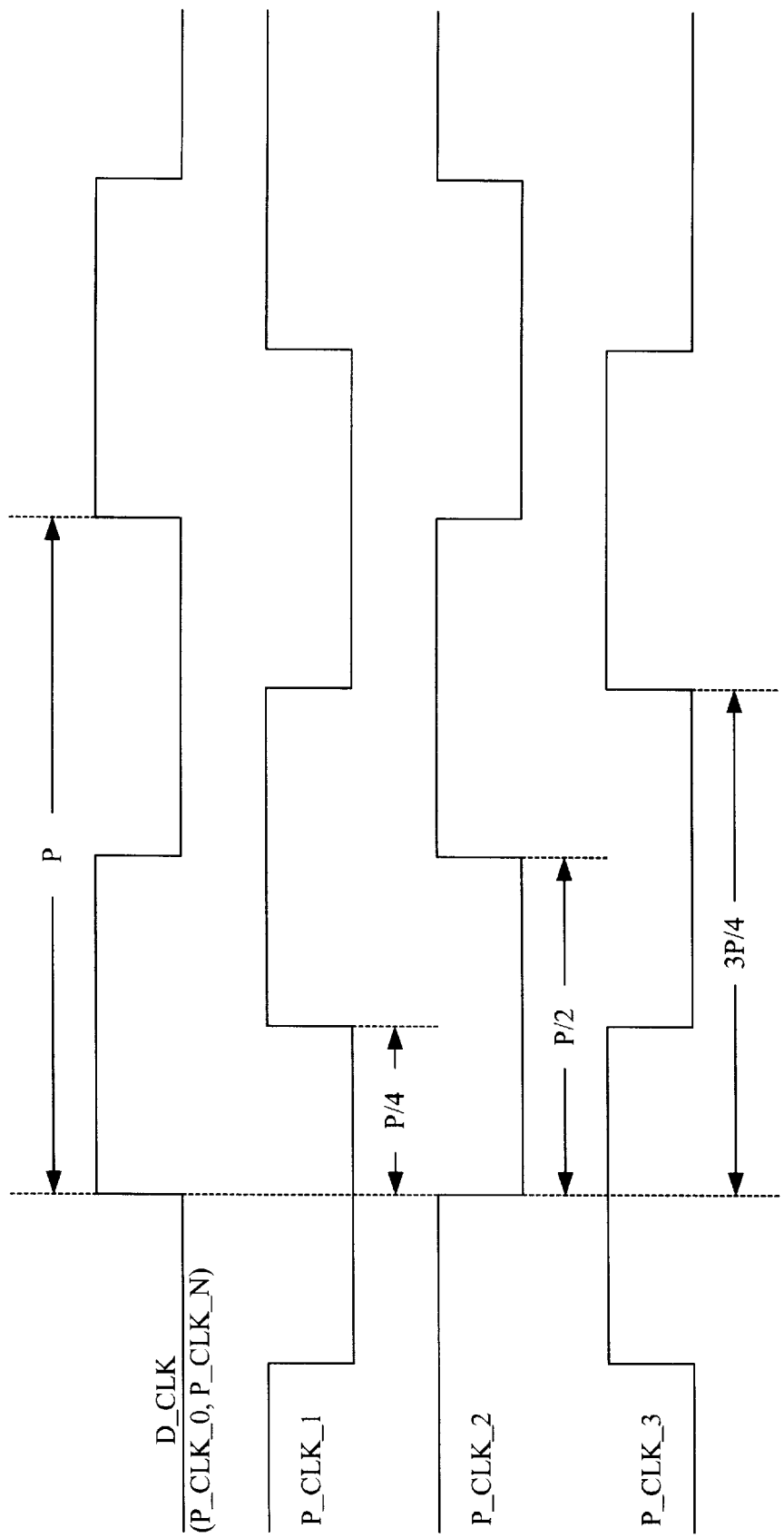
FIG. 4 is a timing diagram for the delay lock loop of FIG. 3.

FIG. 4 illustrates a timing diagram for delay lock loop 300 (FIG. 3) wherein N equals 4. Specifically, clock phase shifter 350 generates phase-shifted clock signal P_CLK_1 90 degrees out of phase with delayed clock signal D_CLK. Thus, phase-shifted clock signal P_CLK_1 is delayed by one-fourth of clock period P. Clock phase shifter 350 generates phase-shifted clock signal P_CLK_2 180 degrees out of phase with delayed clock signal D_CLK. Thus, phase-shifted clock signal P_CLK_2 is delayed by half of clock period P. Finally, clock phase shifter 350 generates phase-shifted clock signal P_CLK_3 270 degrees out of phase with delayed clock signal D_CLK. Thus, phase-shifted clock signal P_CLK_3 is delayed by three-fourths of clock period P.

Returning to FIG. 3, clock phase shifter 350 provides the phase-shifted clock signals to various input terminals of output generator 340. In some embodiments of delay lock loop 300, clock phase shifter 350 can be configured using one or more configuration signals CFG on an optional configuration bus 360. An embodiment of clock phase shifter 350 that is configured by configuration signals CFG is described below with respect to FIG. 7. Configuration signals CFG are received on configuration terminals 308 and are routed to clock phase shifter 350 and controller 330 by configuration bus 360. Output generator 340 selects either delayed clock signal D_CLK or one of the phase-shifted clock signals to provide as output clock signal O_CLK. For embodiments of delay lock loop 300 in which clock phase shifter 350 provides phase-shifted clock signal P_CLK_N, output generator 340 can use phase-shifted clock signal P_CLK_N in place of delayed clock signal D_CLK. Controller 330 controls output generator 340.

Controller 330 receives phase information regarding reference clock signal REF_CLK and skewed clock signal S_CLK from phase detector 320. Specifically, phase detector 320 informs controller 330 whether propagation delay D from delay line 310 should be increased or decreased to achieve synchronization of skewed clock signal S_CLK with reference clock signal REF_CLK. For embodiments of phase detector 320 that only determine whether to increase or decrease propagation delay D, a jitter filter (not shown) can be used to reduce clock jitter. In one embodiment, the jitter filter is an up/down counter (not shown) that decrements by one if propagation delay D should be decreased and increments by one if propagation delay D should be increased. However, propagation delay D is not adjusted until the up/down counter reaches 0 or some other predetermined number. When propagation delay D is adjusted, the up/down counter is reset to one-half the maximum value. In other embodiments, phase detector 320 calculates the amount propagation delay D should be increased or decreased. During lock acquisition, controller 330 attempts to synchronize skewed clock signal S_CLK with reference clock signal REF_CLK so that initial propagation delay ID of propagation delay D is within a lock window W.

Figure 5:
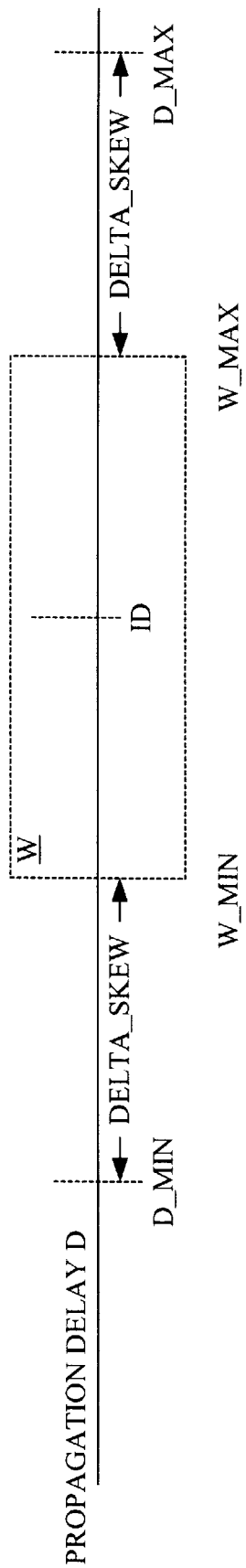
FIG. 5 illustrates a lock window as used in accordance with one embodiment of the present invention.

FIG. 5 illustrates the concepts of lock window W. As explained above, propagation delay D must be between minimum propagation delay D_MIN and maximum propagation delay D_MAX. Typical values for D_MIN and D_MAX are 3.2 nanoseconds and 46.8 nanoseconds, respectively. During lock acquisition, controller 330 ensures that initial propagation delay ID of propagation delay D is within lock window W. Specifically, when synchronization is first established initial propagation delay ID must be between lock window minimum W_MIN and lock window maximum W_MAX. The limits on lock window W are set to guarantee that once delay lock loop 300 completes locks acquisition, delay lock loop 300 can maintain synchronization as long as the system containing delay lock loop 300 operates within the design guidelines of the system.

For example, the system containing delay lock loop 300 generally can operate in a range of operating conditions. The range of operating conditions includes a maximum extreme condition in which propagation delay SKEW is maximized at a propagation delay value SKEW_MAX. Similarly, the range of operating conditions also includes a minimum extreme condition in which propagation delay SKEW is minimized at a propagation delay value SKEW_MIN. Thus, the maximum change (DELTA_SKEW) in propagation delay SKEW during operation of the system is equal to propagation delay value SKEW_MAX minus propagation delay value SKEW_MIN (i.e., DELTA_SKEW=SKEW_MAX−SKEW_MIN). For maximum protection during lock maintenance, lock window minimum W_MIN can be equal to minimum propagation delay D_MIN plus DELTA_SKEW. Similarly, lock window maximum W_MAX can be equal to maximum propagation delay D_MAX minus DELTA_SKEW. In one embodiment of the present invention, lock window minimum W_MIN is equal to approximately 16.5% of maximum propagation delay D_MAX and lock window maximum W_MAX is equal to approximately 67.8% of maximum propagation delay D_MAX.

As explained above with respect to FIG. 1, for a conventional delay lock loop synchronization of skewed clock signal S_CLK with reference clock signal REF_CLK is achieved when propagation delay D plus propagation delay SKEW is equal to a multiple of period P. In equation form:

$$D+SKEW=MULT(P) \qquad (1)$$

where MULT(P) refers to a multiple of P. Usually, the smallest multiple of P greater than SKEW is used.

With delay lock loop 300, controller 330 can also use the delays from the phase-shifted clock signals. Thus delay lock loop 300 can achieve synchronization if propagation delay D plus a phase-shifted delay P_D from a phase-shifted clock signal plus propagation delay SKEW is a multiple of period P. In equation form:

$$D+P\_D\_Z+SKEW=MULT(P) \qquad (2)$$

where P_D_Z refers to a phase-shifted delay from phase-shifted clock signal P_CLK_Z. Usually, the smallest multiple of P greater than propagation delay SKEW plus phase-shifted delay P_D_Z is used. As explained above with respect to FIG. 3, in one embodiment of clock phase shifter 350 phase-shifted delay P_D_Z of a phase-shifted clock signal P_CLK_Z is equal to Z*(P/N), where Z is an integer between 0 and (N−1), inclusive. If Z is equal to 0, controller 330 causes output generator 340 to use delayed clock signal D_CLK as output clock signal O_CLK. Thus, phase-shifted delay P_D_0 is equal to 0.

For clarity, initial delay ID can be referred to initial delay ID_0 if output generator 340 uses delayed clock signal D_CLK for output clock signal O_CLK. Similarly, initial delay ID can be referred to as initial delay ID_Z, if output generator 340 uses phase-shifted clock signal P_CLK_Z for output clock signal O_CLK, where Z is a positive integer between 1 and (N−1), inclusive. Thus, at the end of lock acquisition, equation (2) can be rewritten as:

$$ID\_Z+P\_D\_Z+SKEW=MULT(P) \qquad (3)$$

Re-arranging equation (3) provides:

$$ID\_Z=MULT(P)-SKEW-P\_D\_Z \qquad (4)$$

and substituting Z*(P/N) for P_D_Z provides:

$$ID\_Z=MULT(P)-SKEW-Z*(P/N) \qquad (5)$$

Usually, the smallest multiple of P that results in a positive initial delay ID_Z is used. In situations where initial delay ID_Z is less than minimum propagation delay D_MIN or greater than maximum propagation delay D_MAX, delay lock loop 300 cannot synchronize skewed clock signal S_CLK with reference clock signal REF_CLK using phase-shifted clock signal P_CLK_Z.

Because controller 330 can select any one of phase-shifted clock signals P_CLK_Z to drive output clock signal O_CLK, controller 330 can select from N initial delay values. The possible initial delay values range from a minimum offset value (MULT(P)−SKEW) to a maximum value (MULT(P)−SKEW+(N−1)/ (N * period P)). The difference between each initial delay value is period P divided by N. For example, if N equals four, period P equals 40 nanoseconds, and propagation delay SKEW equals 25 nanoseconds; then initial delays ID_0, ID_1, ID_2, and ID_3 equal 15 nanoseconds, 5 nanoseconds, 35 nanoseconds, and 25 nanoseconds, respectively (as calculated using equation (5)). If N equals four, period P equals 40 nanoseconds, and propagation delay SKEW equals 55 nanoseconds; then initial delays ID_0, ID_1, ID_2, and ID_3 equal 25 nanoseconds, 15 nanoseconds, 5 nanoseconds, and 35 nanoseconds, respectively. Thus, controller 330 is likely to find one or more initial delay values within lock window W. If more than one initial delay value is within lock window W, controller 330 can select any one of the initial delay values within lock window W.

Some embodiments of controller 330 can perform the calculations described above to determine which phase-shifted clock signal P_CLK_Z to use. However, other embodiments use trial and error to determine which phase-shifted clock signal P_CLK_Z to use. An embodiment of controller 330 that uses trial and error is described below with respect to FIG. 9.

Figure 6:
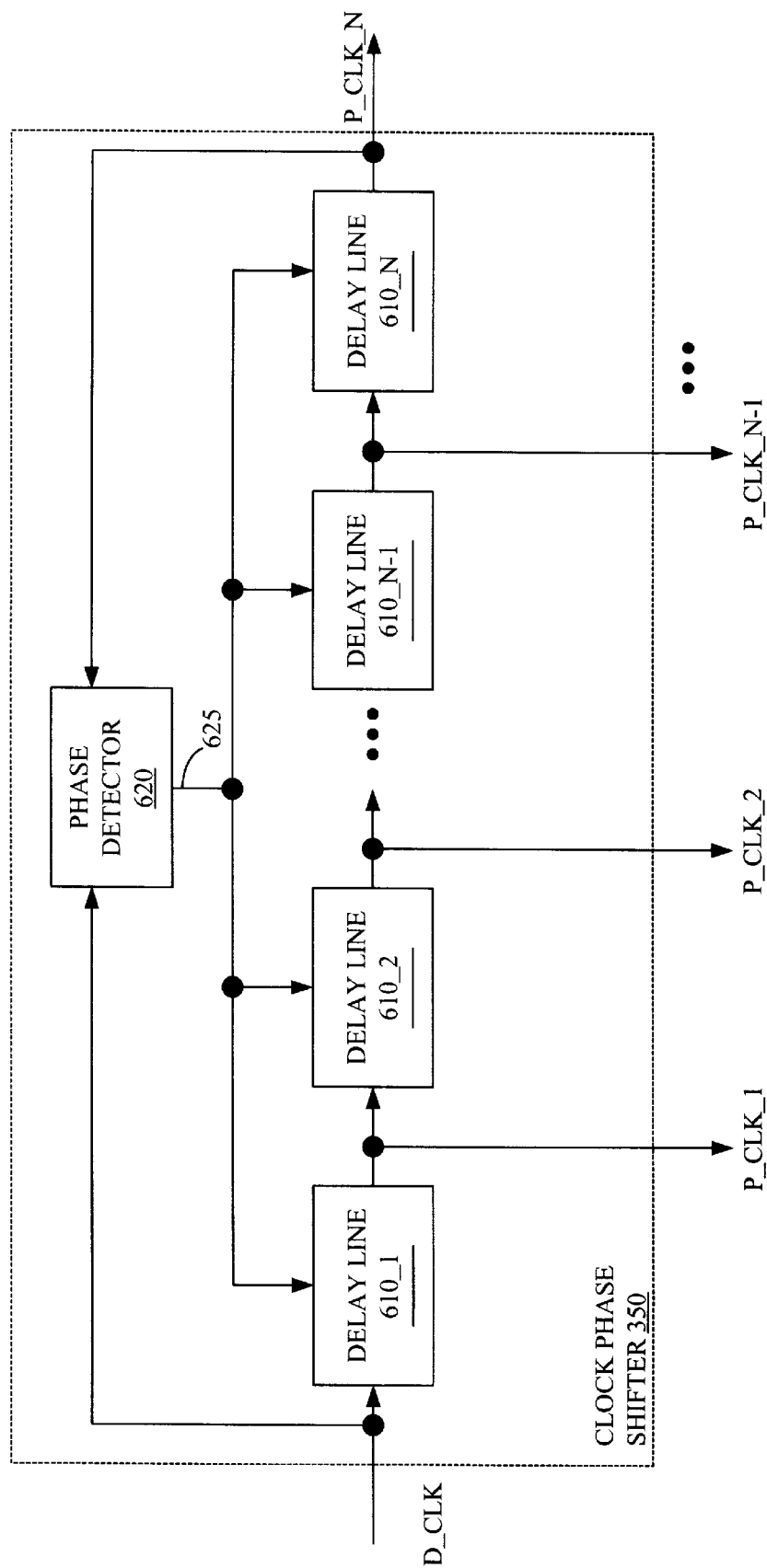
FIG. 6 is a block diagram of an embodiment of a clock phase shifter in accordance with the present invention.

FIG. 6 illustrates one embodiment of clock phase shifter 350 of FIG. 3. The embodiment of clock phase shifter 350 in FIG. 6 comprises a phase detector 620 and a plurality of delay lines 610_1 to 610_N. Delay lines 610_1 to 610_N are coupled in series. The input terminal of delay line 610_1 receives an input clock signal such as delayed clock signal D_CLK (FIG. 3). The output terminal of delay line 610_N is coupled to an input terminal of phase detector 620. Phase detector 620 also receives input clock signal D_CLK on another input terminal. Phase detector 620 controls all the delay lines in parallel via control line 625, and each delay line provides the same amount of propagation delay. Consequently, input clock signal D_CLK and the clock signal P_CLK–N on the output terminal of delay line 610_N are synchronized, i.e., in phase. Further, phase detector 620 causes the total propagation delay generated by delay lines 610_1 to 610_N to be equal to one period P of the input clock. Thus, each delay line provides a propagation delay of P/N. Thus, the output terminal of delay line 610_1 provides a clock signal that is delayed from the input clock signal by P/N whereas the output terminal of delay line 610_2 provides a clock signal that is delayed from the input clock signal by 2*P/N. In general, the output terminal of delay line 610_Z provides a clock signal that is delayed from the input clock signal by Z*P/N, where Z is an integer between 1 and N–1, inclusive. Accordingly, if the input clock signal is delayed clock signal D_CLK, the output terminals of delay lines 610_1 to 610_N–1 provide phase-shifted clock signals P_CLK_1 to P_CLK_N–1, respectively. Some embodiments of clock phase shifter 350 also generate a clock signal P_CLK_N on the output terminal of delay line 610_N that has the same phase as delayed clock signal D_CLK.

Figure 7:
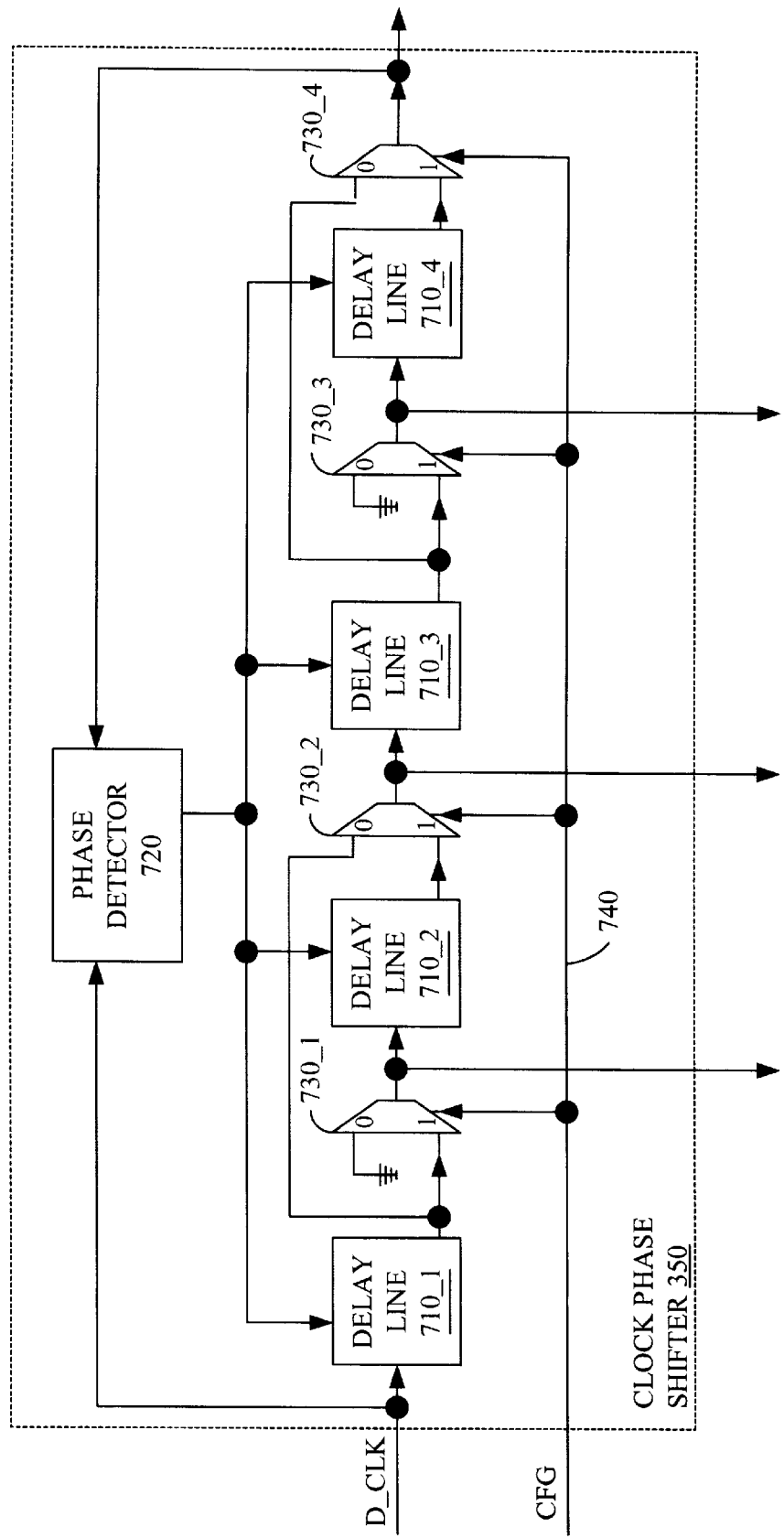
FIG. 7 is a block diagram of another embodiment of a clock phase shifter in accordance with the present invention.

FIG. 7 shows a configurable embodiment of clock phase shifter 350 of FIG. 3. Specifically, the clock phase shifter of FIG. 7 can be configured in a first mode to produce three phase-shifted clock signals that are 90 degrees, 180 degrees, and 270 degrees out of phase with an input clock signal. In a second mode, the clock phase shifter of FIG. 7 produces a single phase-shifted clock signal that is 180 degrees out of phase with the input clock signal. The clock phase shifter of FIG. 7 comprises a phase detector 720, delay lines 710_1, 710_2, 710_3, and 710_4, and multiplexers 730_1, 730_2, 730_3, and 730_4. A configuration line 740 is coupled to the select terminal of multiplexers 730_1 to 730_4.

The input terminal of delay line 710_1 is coupled to receive an input clock signal such as delayed clock signal D_CLK (FIG. 3). The output terminal of each delay line 710_Z is coupled to the logic one input terminal of multiplexer 730_Z, where Z is an integer between 1 and 3, inclusive. The output terminal of each multiplexer 730_Z is coupled to the input terminal of delay line 710_Z+1, where Z is an integer between 1 and 3, inclusive. The output terminal of multiplexer 730_4 is coupled to an input terminal of phase detector 720. The logic zero input terminals of multiplexer 730_1 and multiplexer 730_3 are coupled to ground. However, the logic zero input terminal of multiplexer 730_2 is coupled to the output terminal of delay line 710_1. Similarly, the logic zero input terminal of multiplexer 730_4 is coupled to the output terminal of delay line 710_3. Phase detector 720 also receives input clock signal D_CLK on another input terminal. Phase detector 720 controls delay lines 710_1 to 710_4 in parallel as described above with respect to phase detector 620.

If configuration line 740 is pulled to logic one, which puts the embodiment of FIG. 7 into the first mode, delay lines 710_1 to 710_4 are coupled in series. In the first mode, each delay line provides a delay of P/4. Thus, if the input clock signal is delayed clock signal D_CLK, the output terminal of each multiplexer 730_Z can provide phase-shifted clock signals P_CLK_1, P_CLK_2, and P_CLK_3.

However, if configuration line 740 is pulled to logic zero, which puts the embodiment of FIG. 7 into the second mode, only delay lines 710_1 and 710_3 are coupled in series. Delay lines 710_2 and 710_4 have their input terminal coupled to ground through multiplexers 730_1 and 730_3, respectively. In the second mode delay lines 710_1 and 710_3 each provide a delay of P/2. Coupling the input terminals of delay lines 710_2 and 710_4 to ground reduces power consumption and switching noise. However, in the second mode the embodiment of FIG. 7 produces only one output clock signal, which is 180 degrees out of phase with the input clock signal and is generated at the output terminal of multiplexer 730_2.

Figure 8:
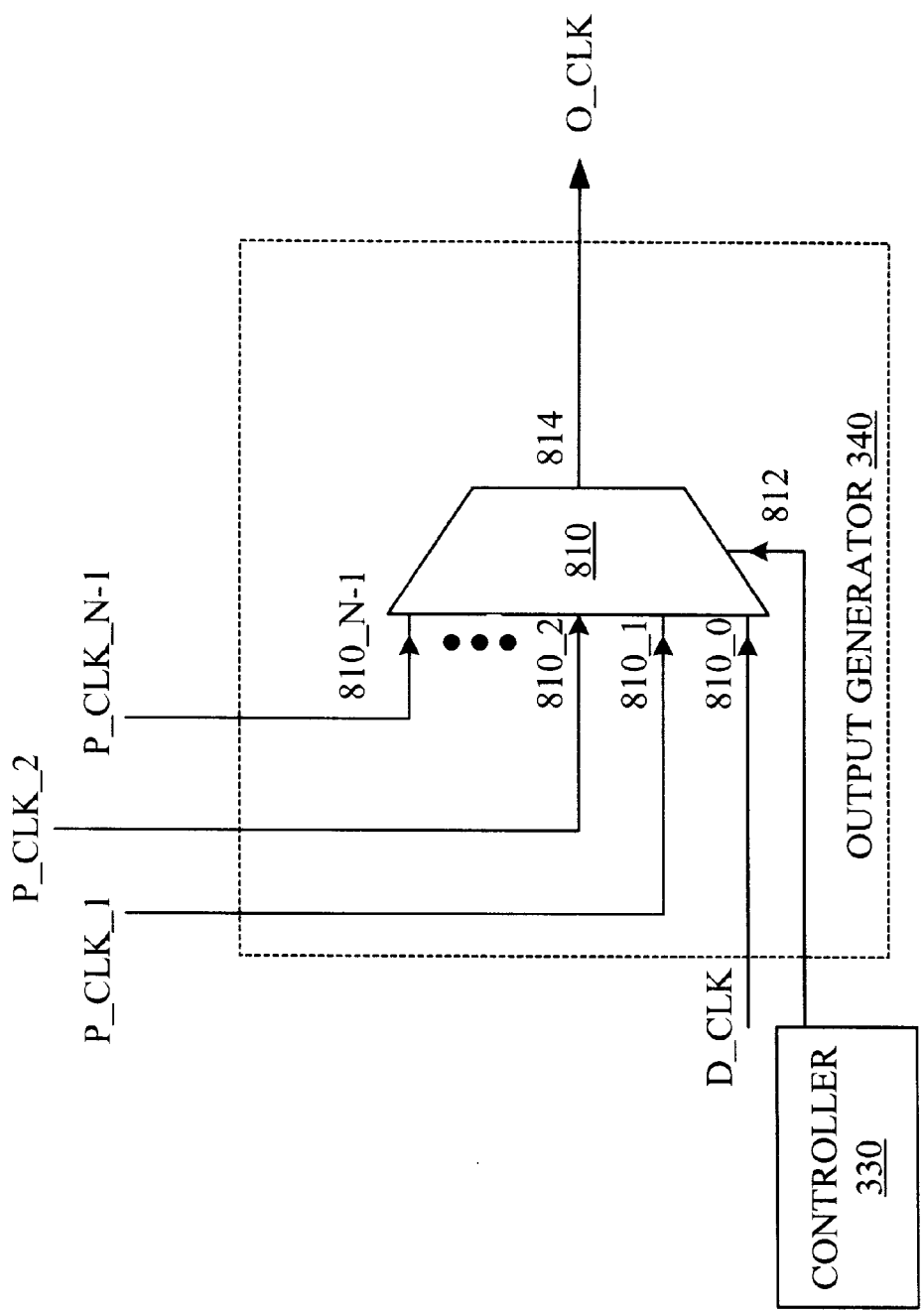
FIG. 8 is a block diagram of an output generator in accordance with the present invention.

FIG. 8 shows one embodiment of output generator 340 of FIG. 3. The output generator of FIG. 8 comprises an N-input multiplexer 810. N-input multiplexer 810 has N input terminals, referenced as 810_0 to 810_N–1, select terminals 812, and an output terminal 814. When the embodiment of output generator 340 of FIG. 8 is used in delay lock loop 300 of FIG. 3, select terminals 812 are coupled to controller 330, input terminal 810_0 is coupled to receive delayed clock signal D_CLK, output terminal 814 provides output clock signal O_CLK, and input terminals 810_1 to 810_N–1 are coupled to receive phase-shifted clock signals P_CLK_1 to P_CLK_N–1, respectively. Select signals on select terminals 812 determine which input signal is provided on output terminal 814. Other embodiments of output generator 340 may include additional circuitry, such as clock buffers and clock dividers. In addition, some embodiments of output generator 340 drive additional clock signals, such as various versions of the phase-shifted clock signals.

Figure 9:
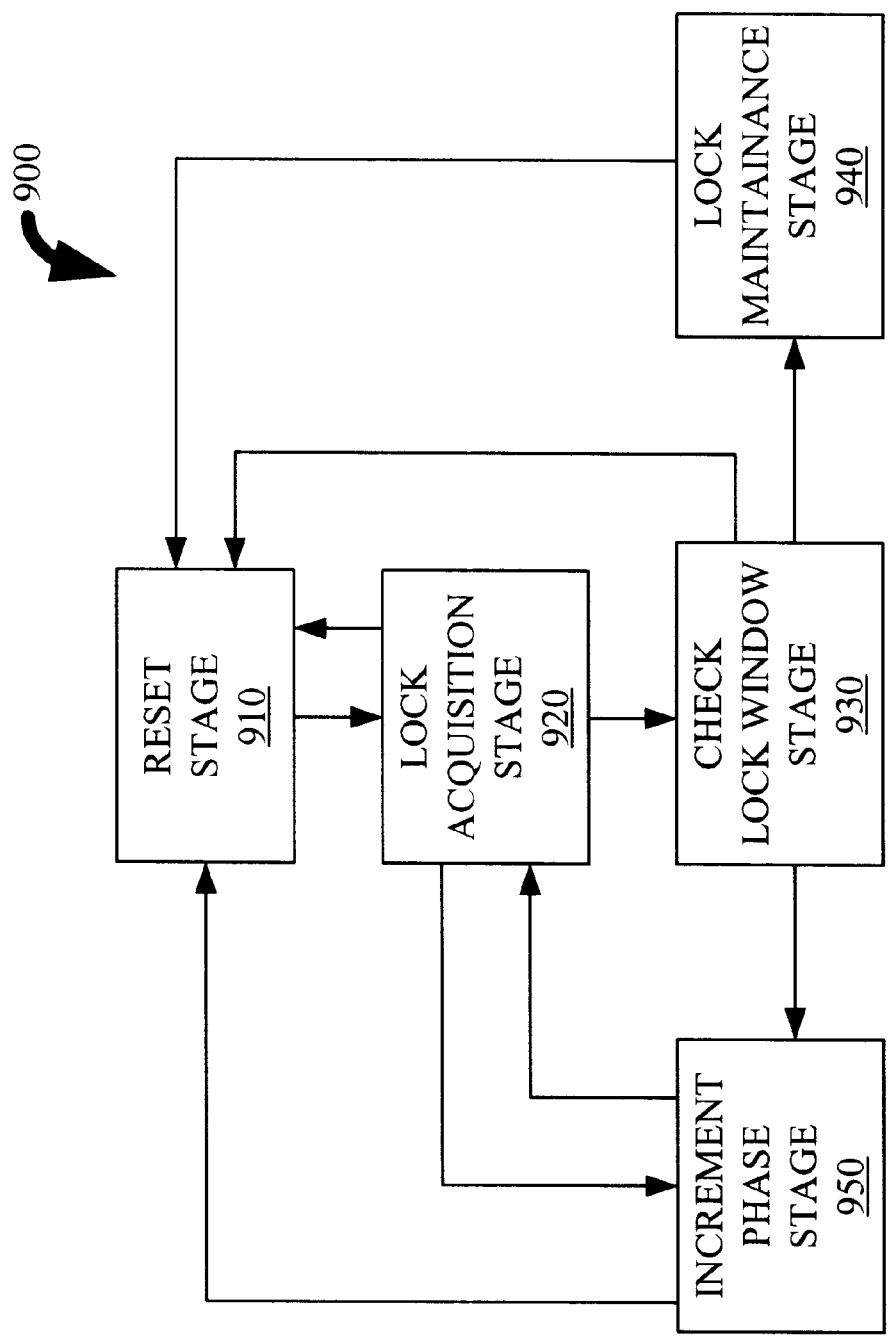
FIG. 9 is a state diagram for an embodiment of a controller in accordance with the present invention.

FIG. 9 shows a state diagram 900 for one embodiment of controller 330 of FIG. 3. On power-up or reset, controller 330 transitions to reset stage 910. In reset stage 910, controller 330 sets a phase counter (not shown) to zero, which causes output generator 340 to provide delayed clock signal D_CLK as output clock signal O_CLK, and adjusts propagation delay D of delay line 310 (FIG. 3) to a starting delay value. Starting delay values for propagation delay D include, for example, minimum propagation delay D_MIN, maximum propagation delay D_MAX, or the average of minimum propagation delay D_MIN and maximum propagation delay D_MAX. Controller 910 then transitions to lock acquisition stage 920.

In lock acquisition stage 920, controller 330 synchronizes reference clock signal REF_CLK and skewed clock signal S_CLK. Specifically, controller 330 adjusts propagation delay D of delay line 310 based on signals from phase detector 320. Phase detector 320 determines whether propagation delay D must be increased or decreased to synchronize skewed clock signal S_CLK with reference clock signal REF_CLK. Lock acquisition is described above in greater detail with respect to FIGS. 3–6; therefore, the description is not repeated. In some embodiments, clock phase shifter 350 is also reset by the power on/reset signal. For some of these embodiments, controller 330 does not adjust propagation delay D until after clock phase shifter 350 produces phase-shifted clock signals P_CLK_1 to P_CLK_N-1. If controller 330 cannot synchronize skewed clock signal S_CLK with reference clock signal REF_CLK, controller 330 transitions to increment phase stage 950, described below. Otherwise, controller 330 transitions to check lock window stage 930 after controller 330 synchronizes skewed clock signal S_CLK with reference clock signal REF_CLK (with an initial propagation delay ID in delay line 310).

In check lock window stage 930, controller 330 must determine whether initial propagation delay ID is within lock window W. Specifically, propagation delay ID is within lock window W if propagation delay ID is greater than lock window minimum W_MIN and less than lock window maximum W_MAX. If initial propagation delay ID is not within lock window W, controller 330 transitions to increment phase stage 950. Otherwise, controller 330 transitions to lock maintenance stage 940.

In lock maintenance stage 940, controller 330 adjust propagation delay D of delay line 310 to maintain synchronization of skewed clock signal S_CLK with reference clock signal REF_CLK. Lock maintenance is described above in greater detail; therefore, the description is not repeated. As described above, the present invention can maintain lock throughout the systems environment conditions. Therefore, controller 330 remains in lock maintenance stage 940 unless a reset occurs that causes controller 330 to transition to reset stage 910.

In increment phase stage 950, controller 330 increments the phase counter, which causes output generator 340 to select a different phase-shifted clock signal. Further, controller 330 resets delay line 310 so that propagation delay D returns to the starting delay value used in reset stage 910. Controller 330 then transitions to lock acquisition stage 920 and proceeds as described above.

Figure 10:
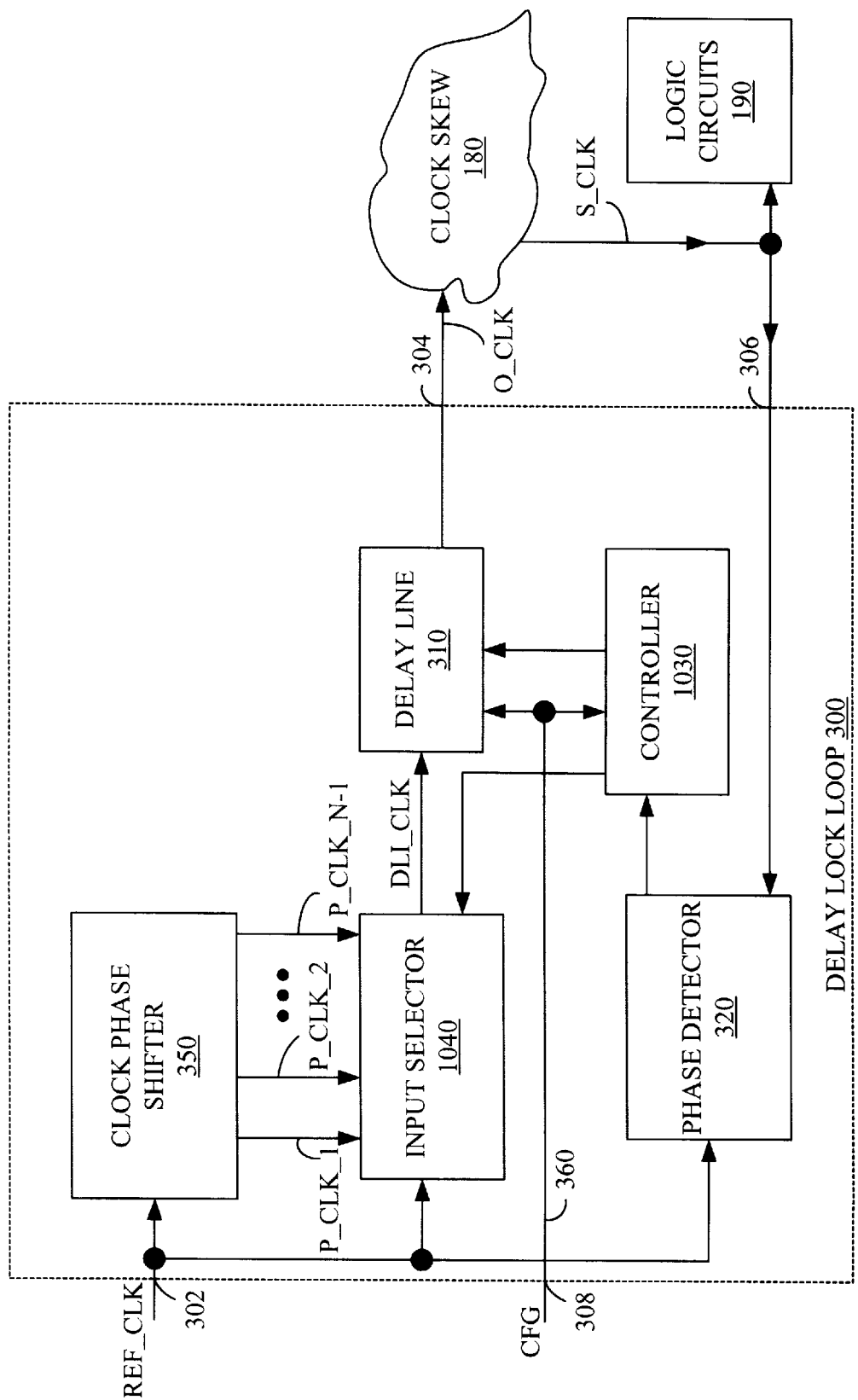
FIG. 10 is a block diagram of a system using another embodiment of a delay lock loop in accordance with the present invention.

FIG. 10 is a block diagram of another embodiment of delay lock loop 300. The embodiment of FIG. 10 uses the same principles as described above with respect to the embodiment of FIG. 3. However, in the embodiment of FIG. 10, clock phase shifter 350 generates phase-shifted clock signals P_CLK_1 to P_CLK_N-1 using reference clock signal REF_CLK. Reference clock signal REF_CLK and phase-shifted clock signals P_CLK_1 to P_CLK_N-1 are coupled to an input selector 1040. Input selector 1040 selects either reference clock signal REF_CLK or one of phase-shifted clock signals P_CLK_1 to P_CLK_N-1 as a delay line input clock signal DLI_CLK, which is provided to the input terminal of delay line 310. Delay line 310 drives output clock signal O_CLK. A controller 1030 controls input selector 1040 and delay line 310 based on the phase information provided by phase detector 320 so that delay line 310 provides a propagation delay D that synchronizes skewed clock signal S_CLK with reference clock signal REF_CLK. Input selector 1040 can be implemented using the same circuit design as output generator 340.

In the various embodiments of the present invention, novel structures have been described for delay lock loops. By using a clock phase shifter to provide propagation delays proportional to the period of a clock signal, the present invention can provide clock signal control of the initial propagation delay at lock acquisition. By accepting only initial propagation delays within a lock window, the present invention can maintain synchronization of the clock signals over the entire range of environmental conditions of a system using the present invention. Further, since the clock phase shifter provides propagation delays proportional to the period of the clock signal, the present invention is applicable to systems using both high and low frequency clock signals. In addition, the delay lock loop of the present invention can be implemented with purely digital circuits that can be completely incorporated on a single silicon chip such as an FPGA, a DSP chip, or a microprocessor.

The various embodiments of the structures and methods of this invention that are described above are illustrative only of the principles of this invention and are not intended to limit the scope of the invention to the particular embodiments described. For example, in view of this disclosure those skilled in the art can define other clock phase shifters, delay lines, output generators, controllers, phase detectors, and so forth, and use these alternative features to create a method, circuit, or system according to the principles of this invention. Thus, the invention is limited only by the following claims.

What is claimed is:

1. A delay lock loop (DLL) circuit having a reference input terminal, a feedback input terminal, and an output terminal, the DLL circuit comprising:
   a first delay line coupled to the reference input terminal;
   a clock phase shifter coupled to the first delay line;
   an output generator coupled to the output terminal of the DLL circuit, the first delay line, and the clock phase shifter; and
   a first phase detector coupled to the feedback input terminal, the reference input terminal and the first delay line, wherein the phase detector is configured to synchronize a first clock signal on the reference input terminal with a second clock signal on the feedback input terminal.

2. The DLL circuit of claim 1, wherein the clock phase shifter generates at least one phase-shifted clock signal.

3. The DLL circuit of claim 2, wherein the at least one phase-shifted clock signal is coupled to the output generator.

4. The DLL circuit of claim 1, wherein the clock phase shifter generates a plurality of (N-1) phase-shifted clock signals with each of the phase-shifted clock signals phase-shifted by 360/N degrees from another phase-shifted clock signal within the plurality of phase-shifted clock signals.

5. The DLL circuit of claim 1, wherein the output generator is coupled to the first delay line through the clock phase shifter.

6. The DLL circuit of claim 1, wherein:
   the delay line provides a propagation delay for the first clock signal on the reference input terminal; and
   the delay line decreases the propagation delay if the second clock signal on the feedback input terminal lags the first clock signal.

7. The DLL circuit of claim 6, wherein the delay line increases the propagation delay if the first clock signal lags the second clock signal.

8. The DLL circuit of claim 1, further comprising a controller coupled to the output generator and coupled between the first delay line and the phase detector.

9. The DLL circuit of claim 8, wherein:
   the delay line provides a propagation delay for the first clock signal on the reference input terminal;
   the controller decreases the propagation delay if the second clock signal on the feedback input terminal lags the first clock signal; and
   the controller increases the propagation delay if the first clock signal lags the second clock signal.

10. A delay lock loop (DLL) circuit having a reference input terminal, a feedback input terminal, and an output terminal, the DLL circuit comprising:

a first delay line coupled to the reference input terminal;
a clock phase shifter coupled to the first delay line, wherein the clock phase shifter comprises:
  a second delay line having
    an input terminal coupled to the first delay line and
    an output terminal;
  a third delay line having
    an input terminal coupled to the output terminal of the second delay line and
    an output terminal; and
  a second phase detector controlling the second delay line and the third delay line, the second phase detector having a first input terminal coupled to the first delay line and a second input terminal coupled to the output terminal of the third delay line;
an output generator coupled to the output terminal of the DLL circuit, the first delay line, and the clock phase shifter; and
a first phase detector coupled to the feedback input terminal, the reference input terminal and the first delay line.

11. The DLL circuit of claim 10, wherein the input terminal of the third delay line is coupled to the output terminal of the second delay line through a first multiplexer.

12. The DLL circuit of claim 11, wherein the second input terminal of the second phase detector is coupled to the output terminal of the third delay line through a second multiplexer.

13. The DLL circuit of claim 12, wherein:
the first multiplexer has a first input terminal coupled to the output terminal of the second delay line and an output terminal coupled to the input terminal of the third delay line; and
the second multiplexer has a first input terminal coupled to the output terminal of the third delay line and an output terminal coupled to the second input terminal of the second phase detector.

14. The DLL circuit of claim 10, wherein the input terminal of the third delay line is coupled to the output terminal of the second delay line through a fourth delay line.

15. The DLL circuit of claim 10, wherein:
the input terminal of the third delay line is coupled to the output terminal of the second delay line through a fourth delay line, a fifth delay line, a first multiplexer, a second multiplexer, and a third multiplexer; and
the second input terminal of the second phase detector is coupled to the output terminal of the third delay line through a fourth multiplexer.

16. The DLL circuit of claim 15, wherein:
the first multiplexer has a first input terminal coupled to the output terminal of the second delay line, a second input terminal coupled to ground, and an output terminal;
the fourth delay line has an input terminal coupled to the output terminal of the first multiplexer, and an output terminal;
the second multiplexer has a first input terminal coupled to the output terminal of the fourth delay line, a second input terminal coupled to the output terminal of the second delay line, and an output terminal;
the fifth delay line has an input terminal coupled to the output terminal of the second multiplexer, and an output terminal;
the third multiplexer has a first input terminal coupled to the output terminal of the fifth delay line, a second input terminal coupled to ground, and an output terminal coupled to the input terminal of the third delay line; and
the fourth multiplexer has a first input terminal coupled to the output terminal of the third delay line, a second input terminal coupled to the output terminal of the fifth delay line, and an output terminal coupled to the second input terminal of the second phase detector.

17. A method to generate an output clock signal from a reference clock signal so that a skewed clock signal is synchronized with the reference clock signal, the skewed clock signal being skewed from the output clock signal by a skew propagation delay, the method comprising the steps of:
delaying the reference clock signal by a propagation delay to generate a delayed clock signal;
phase shifting the delayed clock signal to generate one or more phase-shifted clock signals; and
selecting the output clock signal from a group of clocks signals consisting of the delayed clock signal and the one or more phase-shifted clock signals by selecting the delayed clock signal as the output clock signal;
adjusting the propagation delay to a first initial delay, thereby synchronizing the skewed clock signal with the reference clock signal; and
determining whether the first initial delay is within a lock window.

18. The method of claim 17, wherein the step of phase shifting the delayed clock signal to generate one or more phase-shifted clock signals comprises the steps of:
phase shifting the delayed clock signal to generate a first phase-shifted clock signal; and
phase shifting the first phase-shifted clock signal to generate a second phase-shifted clock signal.

19. The method of claim 18, wherein the first phase-shifted clock signal is phase-shifted 180 degrees from the delayed clock signal.

20. The method of claim 18, wherein the step of phase shifting the delayed clock signal to generate one or more phase-shifted clock signals further comprises the steps of:
phase shifting the second phase-shifted clock signal to generate a third phase-shifted clock signal; and
phase shifting the third phase-shifted clock signal to generate a fourth phase-shifted clock signal.

21. The method of claim 20, wherein:
the first phase-shifted clock signal is phase-shifted 90 degrees from the delayed clock signal;
the second phase-shifted clock signal is phase-shifted 180 degrees from the delayed clock signal; and
the third phase-shifted clock signal is phase-shifted 270 degrees from the delayed clock signal.

22. The method of claim 17, wherein if the first initial delay is not within the lock window, the step of selecting the output clock signal further comprises the steps of:
selecting a first phase-shifted clock signal from the one or more phase-shifted clock signals as the output clock signal;
adjusting the propagation delay to a second initial delay, thereby synchronizing the skewed clock signal with the reference clock signal; and
determining whether the second initial delay is within the lock window.

23. The method of claim 22, wherein if the second initial delay is not within the lock window, the step of selecting the output clock signal further comprises the steps of:

selecting a second phase-shifted clock signal from the one or more phase-shifted clock signals as the output clock signal;

adjusting the propagation delay to a third initial delay, thereby synchronizing the skewed clock signal with the reference clock signal; and determining whether the third initial delay is within the lock window.

24. The method of claim 23, wherein if the third initial delay is not within the lock window, the step of selecting the output clock signal further comprises the steps of:

selecting a third phase-shifted clock signal from the one or more phase-shifted clock signals as the output clock signal;

adjusting the propagation delay to a fourth initial delay, thereby synchronizing the skewed clock signal with the reference clock signal; and determining whether the fourth initial delay is within the lock window.

\* \* \* \* \*